US009601495B2

(12) United States Patent
Zang et al.

(10) Patent No.: US 9,601,495 B2
(45) Date of Patent: Mar. 21, 2017

(54) THREE-DIMENSIONAL SEMICONDUCTOR DEVICE WITH CO-FABRICATED ADJACENT CAPACITOR

(71) Applicant: GLOBALFOUNDRIES Inc., Grand Cayman, KY (US)

(72) Inventors: Hui Zang, Guilderland, NY (US); Min-hwa Chi, Malta, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/814,322

(22) Filed: Jul. 30, 2015

(65) Prior Publication Data
US 2017/0033113 A1    Feb. 2, 2017

(51) Int. Cl.
H01L 27/10    (2006.01)
H01L 29/66    (2006.01)
H01L 27/108   (2006.01)

(52) U.S. Cl.
CPC .... H01L 27/10826 (2013.01); H01L 27/1085 (2013.01); H01L 27/10879 (2013.01); H01L 27/10888 (2013.01); H01L 29/66545 (2013.01)

(58) Field of Classification Search
CPC ........... H01L 27/10826; H01L 27/1085; H01L 27/10879; H01L 27/10888; H01L 29/66545
See application file for complete search history.

(56) References Cited

U.S. PATENT DOCUMENTS

| | | | | |
|---|---|---|---|---|
| 7,888,201 B2* | 2/2011 | Yeo | .......................... | H01L 21/84 257/E21.661 |
| 8,659,097 B2* | 2/2014 | Mor | ...................... | H01L 29/785 257/401 |
| 8,900,934 B2* | 12/2014 | Adam | .................. | H01L 27/1211 257/347 |
| 2007/0018237 A1* | 1/2007 | Kim | .................. | H01L 21/28273 257/324 |
| 2008/0237678 A1* | 10/2008 | Datta | ................ | H01L 27/10873 257/313 |
| 2009/0085121 A1* | 4/2009 | Park | ...................... | H01L 27/228 257/368 |

(Continued)

OTHER PUBLICATIONS

Hamzaoglu, et al., "A 1Gb 2GHz Embedded DRAM in 22nm Tri-Gate CMOS Technology," 2014 IEEE International Solid-State Circuits Conference, Digest of Technical Papers, pp. 230-232.

(Continued)

*Primary Examiner* — Ida M Soward
(74) *Attorney, Agent, or Firm* — Wayne F. Reinke, Esq.; Heslin Rothenberg Farley & Mesiti P.C.

(57) ABSTRACT

A three-dimensional semiconductor device includes a semiconductor substrate, fin(s) coupled to the substrate and surrounded at a bottom portion thereof by isolation material, each fin including a source region, a drain region and a channel region therebetween, a first gate and spacers over a portion of each fin, and a second gate and spacers, the second gate encompassing a common end portion of each fin. The first gate and corresponding source and drain regions act as an access transistor, and the second gate and common end portion(s) of the fin(s) act as a storage capacitor, and a top surface of the second gate acts as a plate for the storage capacitor, when multiple cells are arranged in an array.

11 Claims, 9 Drawing Sheets

(56) References Cited

U.S. PATENT DOCUMENTS

| | | | | |
|---|---|---|---|---|
| 2009/0251946 A1* | 10/2009 | Juengling | ............. | H01L 27/105 365/149 |
| 2012/0306000 A1* | 12/2012 | Chang | ............... | H01L 29/66545 257/324 |
| 2013/0005102 A1* | 1/2013 | Juengling | ............. | H01L 27/105 438/270 |
| 2014/0209854 A1* | 7/2014 | Bangsaruntip | .......... | H01L 21/77 257/9 |
| 2014/0319623 A1* | 10/2014 | Tsai | ................ | H01L 21/823462 257/401 |
| 2014/0328128 A1* | 11/2014 | Louie | ................ | H01L 21/26586 365/185.17 |
| 2015/0162331 A1* | 6/2015 | Kang | ...................... | H01L 22/34 257/48 |
| 2015/0187767 A1* | 7/2015 | Grisham | ......... | H01L 21/823431 257/401 |
| 2015/0228647 A1* | 8/2015 | Chang | ............. | H01L 21/823431 257/401 |
| 2015/0236131 A1* | 8/2015 | Chang | ................ | H01L 29/66795 257/401 |
| 2015/0279997 A1* | 10/2015 | Koldiaev | .............. | H01L 21/845 257/401 |
| 2015/0287711 A1* | 10/2015 | Kim | .................... | H01L 27/0207 257/344 |
| 2016/0043170 A1* | 2/2016 | Park | .................... | H01L 27/0886 257/369 |
| 2016/0099211 A1* | 4/2016 | Baek | ..................... | H01L 27/088 257/774 |
| 2016/0111542 A1* | 4/2016 | Zhang | ................ | H01L 29/7851 257/401 |
| 2016/0225676 A1* | 8/2016 | Jacob | .................... | H01L 21/845 |

OTHER PUBLICATIONS

Brain, et al., "A 22nm High Performance Embeded DRAM SoC Technology Featuring Tri-gate Transistors and MIMCAP COB," 2013 Symposium on VLSI Technology Digest of Technical Papers, pp. T16-T17.

* cited by examiner

THREE-DIMENSIONAL SEMICONDUCTOR DEVICE WITH CO-FABRICATED ADJACENT CAPACITOR

BACKGROUND OF THE INVENTION

Technical Field

The present invention generally relates to three-dimensional semiconductor structures. More particularly, the present invention relates to a FinFET-based semiconductor device with adjacent integrated storage capacitor.

Background Information

Storage capacitors for FinFET-based semiconductor devices have historically been embedded into the metallization interconnect layers above, e.g., metal-insulator-metal (MIM) capacitors at the Back End of the Line (BEOL). However, the placement of storage capacitors can result in unwanted process complexity and/or cost. For example, for a FinFET-based process to fabricate eDRAM, storage capacitors will add one or more extra masking layers and process steps, as compared to fabrication of the logic device.

Thus, a need continues to exist for an integrated storage capacitor for FinFET-based semiconductor devices.

SUMMARY OF THE INVENTION

The shortcomings of the prior art are overcome and additional advantages are provided through the provision, in one aspect, of a semiconductor device. The semiconductor device comprises a semiconductor substrate, at least one fin coupled to the substrate and surrounded at a bottom portion thereof by isolation material, each fin comprising a source region, a drain region and a channel region therebetween, a first gate and spacers over a portion of each fin, and a second gate and spacers, the second gate encompassing a common end portion of the at least one fin. The first gate and corresponding source and drain regions comprise an access transistor, and the second gate and common end portion of the at least one fin act as a storage capacitor.

In another aspect, a method of forming a FinFET-based memory cell is provided. The method comprises providing a three-dimensional semiconductor structure, the structure including a semiconductor substrate, a plurality of fins coupled to the substrate with lower portions thereof being surrounded by isolation material, the isolation material extending beyond a common end of the plurality of fins, source, drain and channel regions situated in each fin, and a first dummy gate structure spanning the channel regions of the plurality of fins. The method further comprises forming a second dummy gate structure encompassing the common end of the plurality of fins, and replacing dummy gate material of the first and second dummy gate structures with corresponding first and second metal gates, each metal gate comprising a dielectric layer on the fin, at least one work-function layer and an electrode. A transistor formed by the source regions, drain regions, channel regions, the first metal gate acts as an access transistor for a memory cell, and the second metal gate acts as a storage capacitor.

These, and other objects, features and advantages of this invention will become apparent from the following detailed description of the various aspects of the invention taken in conjunction with the accompanying drawings.

DETAILED DESCRIPTION OF THE INVENTION

Figure 1:
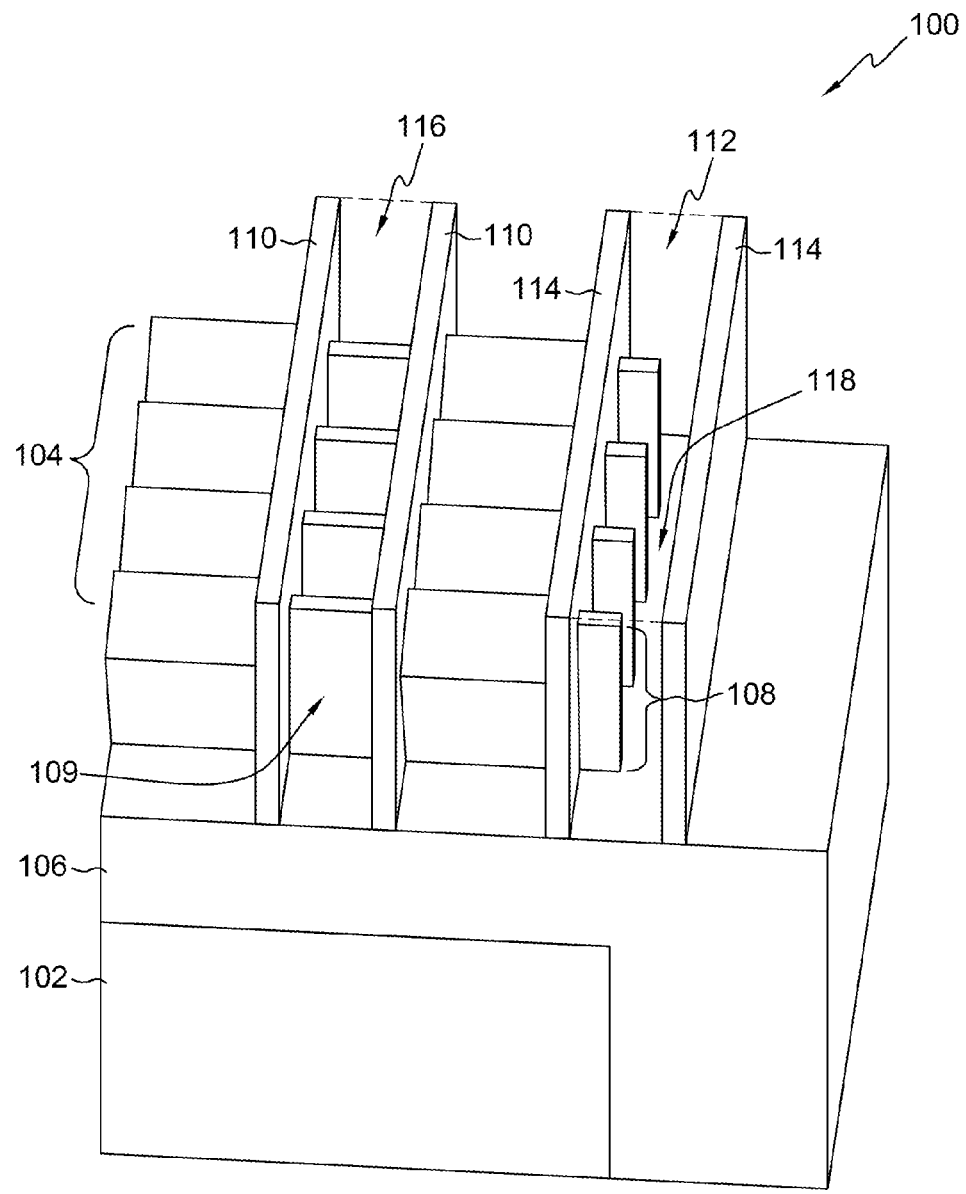
FIG. 1 is a three-dimensional elevational view of one example of a portion of a memory cell, in accordance with one or more aspects of the present invention, the memory cell portion including a bulk semiconductor substrate with multiple fins coupled to the substrate and surrounded at a lower portion thereof by an isolation material while an upper portion thereof is encompassed by a first pair of spacers and an end portion thereof is encompassed by a second pair of spacers, each pair of spacers defining an area for a gate conductor.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

The present invention solves the problems noted regarding the use of MIM capacitors as the storage capacitor for memory cells (e.g., DRAM) at BEOL, by eliminating the MIM capacitor and instead introducing a storage capacitor adjacent to the source/drain with shared gate electrode as the plate of the DRAM array. No extra masks beyond that for the transistor are needed, and the resulting memory cell has a smaller footprint, compared to the conventional MIM capacitor in BEOL.

FIG. 1 is a three-dimensional elevational view of one example of a portion 100 of a memory cell, in accordance with one or more aspects of the present invention, the memory cell portion including a bulk semiconductor substrate 102 with multiple fins 104 coupled to the substrate and surrounded at a lower portion thereof by an isolation material 106 while an upper portion 108 thereof is encompassed by a first pair of spacers 110 and common end portions 112 thereof (in FIG. 1, right end portions of the fins) are encompassed by a second pair of spacers 114, each pair of spacers defining an area (116, 118) for a gate conductor (see FIG. 2) that will encompass a channel area 109.

The starting structure may be conventionally fabricated, for example, using known processes and techniques. Further, unless noted otherwise, conventional processes and techniques may be used to achieve individual steps of the fabrication process of the present invention. However, although only a portion of what is fabricated is shown for simplicity, it will be understood that, in practice, many such structures are typically co-fabricated on the same bulk substrate.

In one example, substrate 102 may include any silicon-containing substrate including, but not limited to, silicon (Si), single crystal silicon, polycrystalline Si, amorphous Si, silicon-on-nothing (SON), silicon-on-insulator (SOI) or silicon-on-replacement insulator (SRI) or silicon germanium substrates and the like. Substrate 102 may in addition or instead include various isolations, dopings and/or device features. The substrate may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), and/or indium antimonide (InSb) or combinations thereof; an alloy semiconductor including GaAsP, AlInAs, GaInAs, GaInP, or GaInAsP or combinations thereof.

The non-planar structure further includes at least one raised semiconductor structure 104 (raised with respect to the substrate). In one example, the raised structures may take the form of a "fin." The raised structure(s) may be recessed first, and then epitaxial semiconductor material grown (into a diamond shape) from the substrate, and may include, for example, any of the materials listed above with respect to the substrate. Further, some or all of the raised structure(s) may include added impurities (e.g., by doping), making them n-type or p-type. The structure further includes isolation material 106 surrounding the at least one raised structure.

Figure 2:
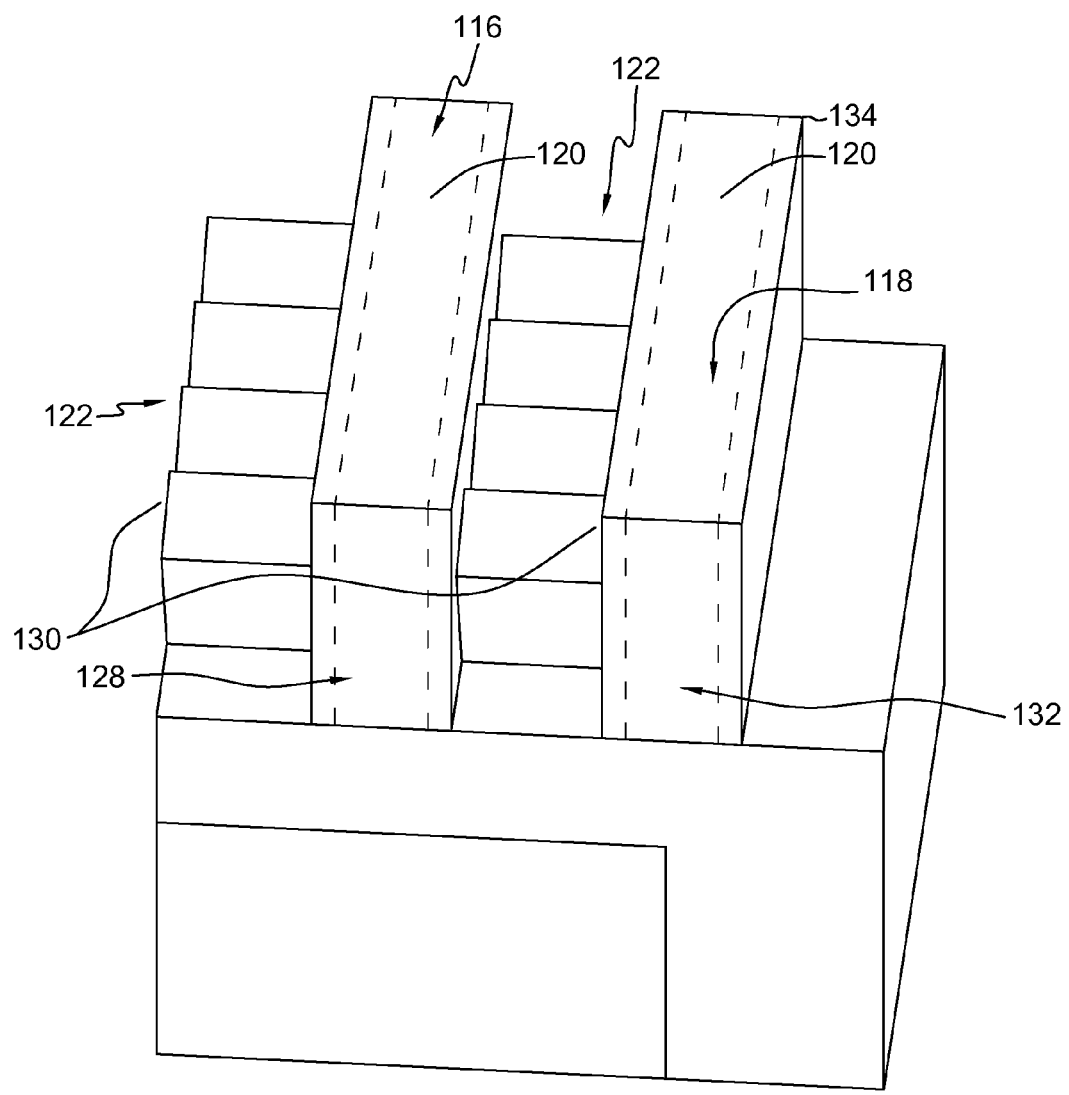
FIG. 2 depicts one example of the memory cell portion of FIG. 1 with dummy gate material in the spacer-defined areas and epitaxial material over the source and drain areas of the fins, the source/drain and left dummy gate acting as an access transistor for the memory cell, and the right dummy gate and end portions of the fins underneath acting as a storage capacitor for the memory cell, in accordance with one or more aspects of the present invention.

FIG. 2 depicts one example of the memory cell portion of FIG. 1 with dummy gate material 120 in the spacer-defined areas (116,118). Note that the source and drain areas of the fins 122 will typically have epitaxial material formed (e.g., by growth) thereover (not shown for simplicity). As one skilled I the art will know, whichever area 122 is designated a source (right or left side), the other will be the drain. In other words, the location of the source and the drain of a transistor are interchangeable. Left dummy gate 128 acts as an access transistor 130 for the memory cell, and the right dummy gate 132 and end portions of the fins underneath act as a storage capacitor 134 for the memory cell, in accordance with one or more aspects of the present invention.

The dummy gate is formed first by deposition of dummy gate materials and patterning by lithography/masking and etch steps. The spacers are formed by deposition of spacer material (e.g. oxide or nitride), then anisotropic etch back. The dummy gate material may include, for example, polysilicon. Note that, typically, a thin dielectric layer (e.g., oxide) is formed between the dummy gate and the fins, but is omitted here for simplicity. The epitaxial material grown on the sources and drains may include, for example, a silicon-based compound semiconductor material (e.g., silicon germanium), and may be selectively grown on exposed Si surface, including a top surface and the sidewalls of the source/drain regions of the fins. The epitaxial material also preferentially grows faster on crystal surfaces (100) and (110), and slower on (111) surface, so that a diamond shape of epitaxial material results and which is bounded by the (111) surface.

Figure 3:
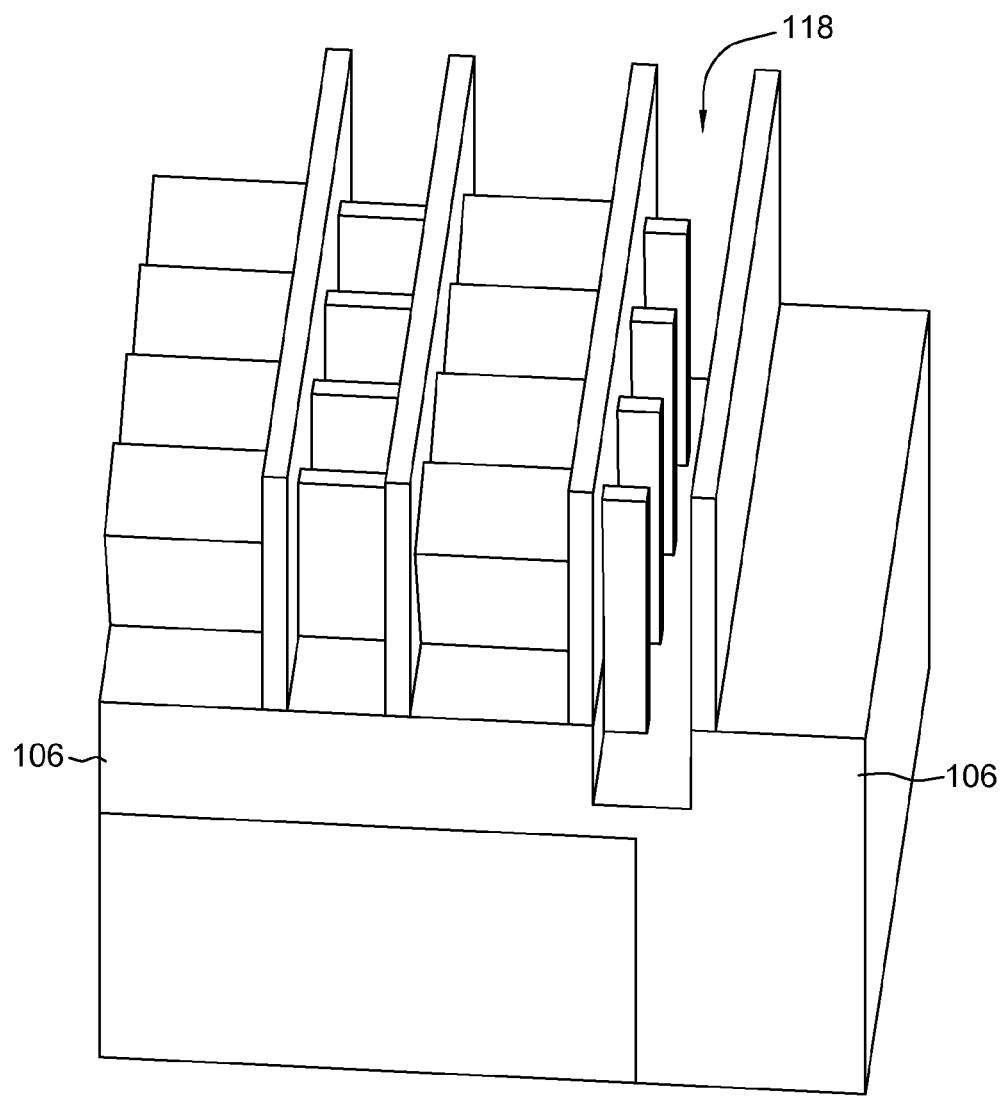
FIG. 3 depicts one example of the memory cell portion of FIG. 1 after recessing the isolation material of the area of the storage capacitor, which increases the capacity of the storage capacitor, in accordance with one or more aspects of the present invention.

FIG. 3 depicts one example of the memory cell portion of FIG. 1 after selectively recessing the isolation material 106 of the area 118 of the storage capacitor, which increases the capacitance of the storage capacitor (when filled with conductive material of a gate electrode), in accordance with one or more aspects of the present invention.

Figure 4:
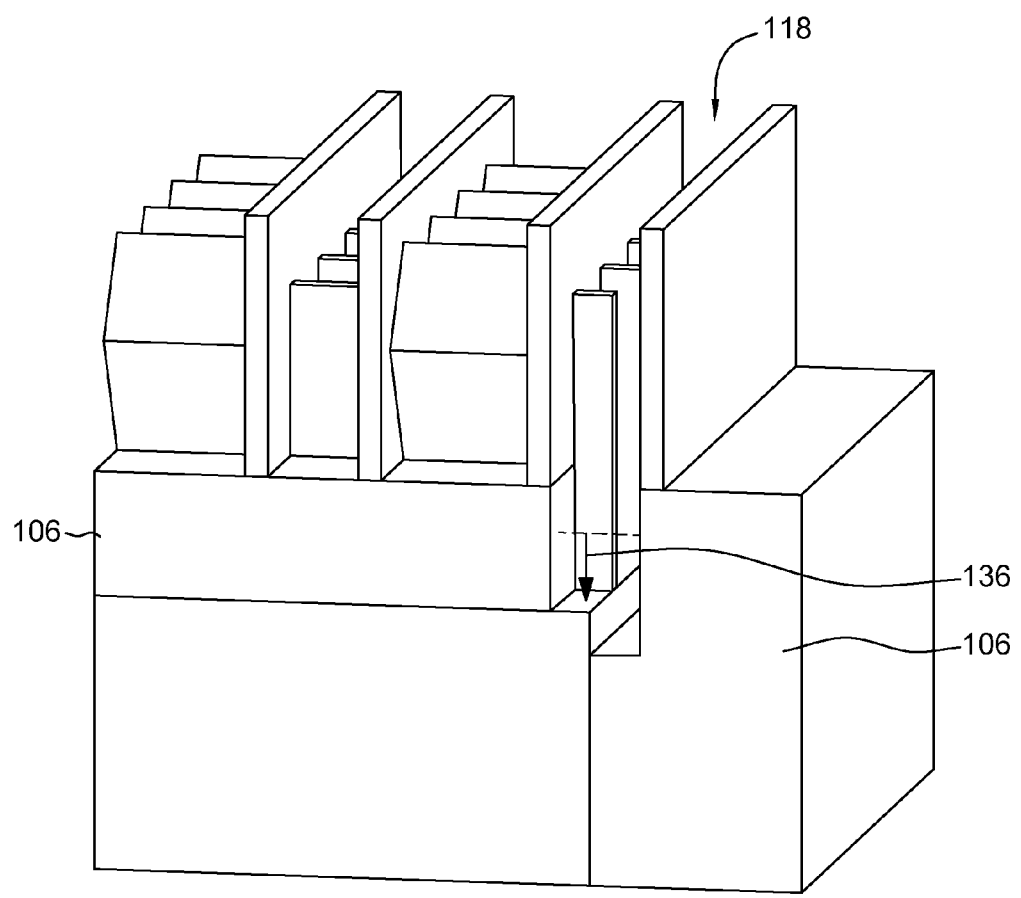
FIG. 4 depicts one example of the memory cell portion of FIG. 3 after further recessing the isolation material in the area of the storage capacitor to still further increase the capacity of the storage capacitor as compared to FIG. 3, in accordance with one or more aspects of the present invention.

FIG. 4 depicts one example of the memory cell portion of FIG. 3 after further selectively recessing 136 the isolation material 106 in the area 118 of the storage capacitor to still further increase the capacitance of the storage capacitor as compared to FIG. 3, in accordance with one or more aspects of the present invention.

In one example, selectively recessing the isolation material of the storage capacitor in either FIG. 3 or FIG. 4 may be accomplished, for example, using lithography and masking steps, after the formation of source/drain junctions and the removal of dummy gate material (e.g., polysilicon) in a replacement-metal-gate (RMG) process flow.

Figure 5:
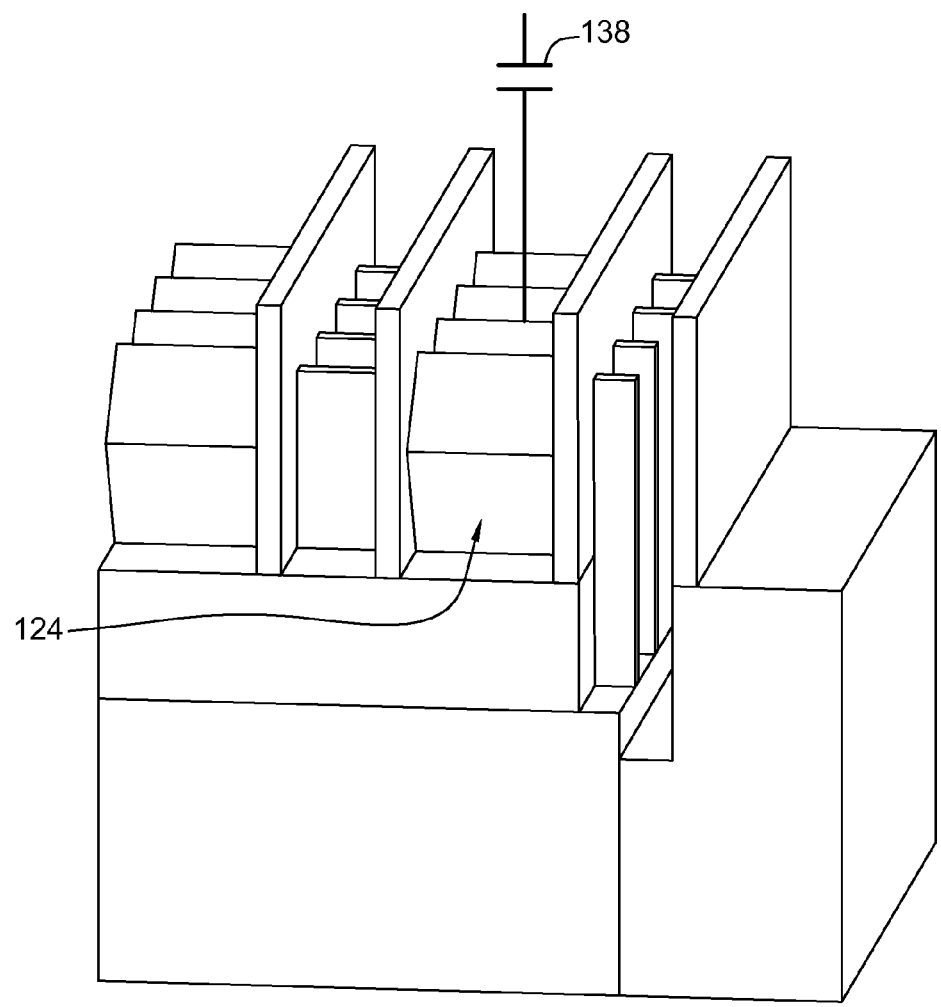
FIG. 5 depicts one example of the memory cell portion of FIG. 4 with an optional second capacitor (schematically shown) electrically coupled to the source of the access transistor, in accordance with one or more aspects of the present invention.

FIG. 5 depicts one example of the memory cell portion of FIG. 4 with an optional second capacitor 138 (schematically shown) electrically coupled to the source 124 of the access transistor, in accordance with one or more aspects of the present invention. The second capacitor 138 can be formed, for example, using conventional processes and techniques for fabricating a MIM capacitor in BEOL.

Figure 6:
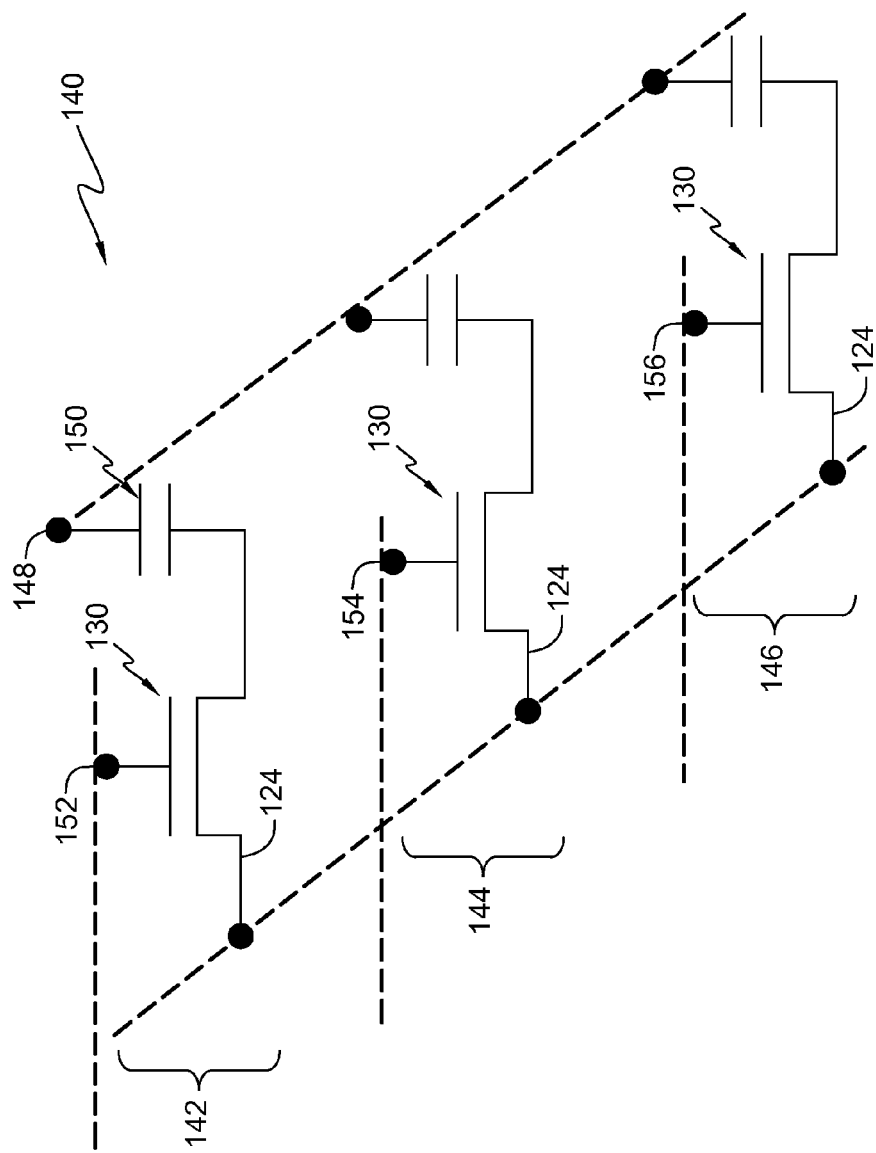
FIG. 6 schematically depicts one example of a portion of a column of memory cells in an array from any of the prior figures implemented, for example, as an eDRAM array, with the plates of the storage capacitors electrically coupled together, the sources of the access transistors electrically coupled together and may, for example, act as the bit line of the eDRAM array, while contacts of each access transistor gate may be tied separately to act as the word lines in the eDRAM array, in accordance with one or more aspects of the present invention. Each memory cell may also represent one row of cells in an array with repeating cells sharing the same wordline (not shown here for simplicity).

FIG. 6 schematically depicts one example of a portion of a column in an array 140 of memory cells (142, 144 and 146) from any of the prior figures implemented, for example, as an eDRAM array, with the top plates of the storage capacitors (e.g., plate 148 of storage capacitor 150) electrically connected together, the sources 124 of the access transistors 130 in a column electrically connected together and may, for example, serve as the bit line of the eDRAM array, while contacts (e.g., contact 152, 154, 156) to the access transistor gates represent separate rows and may serve as the word lines (152, 154, and 156) of the eDRAM array, in accordance with one or more aspects of the present invention. Each memory cell may also represent one row of cells in an array with repeating cells sharing the same wordline (not shown here for simplicity).

Figure 7:
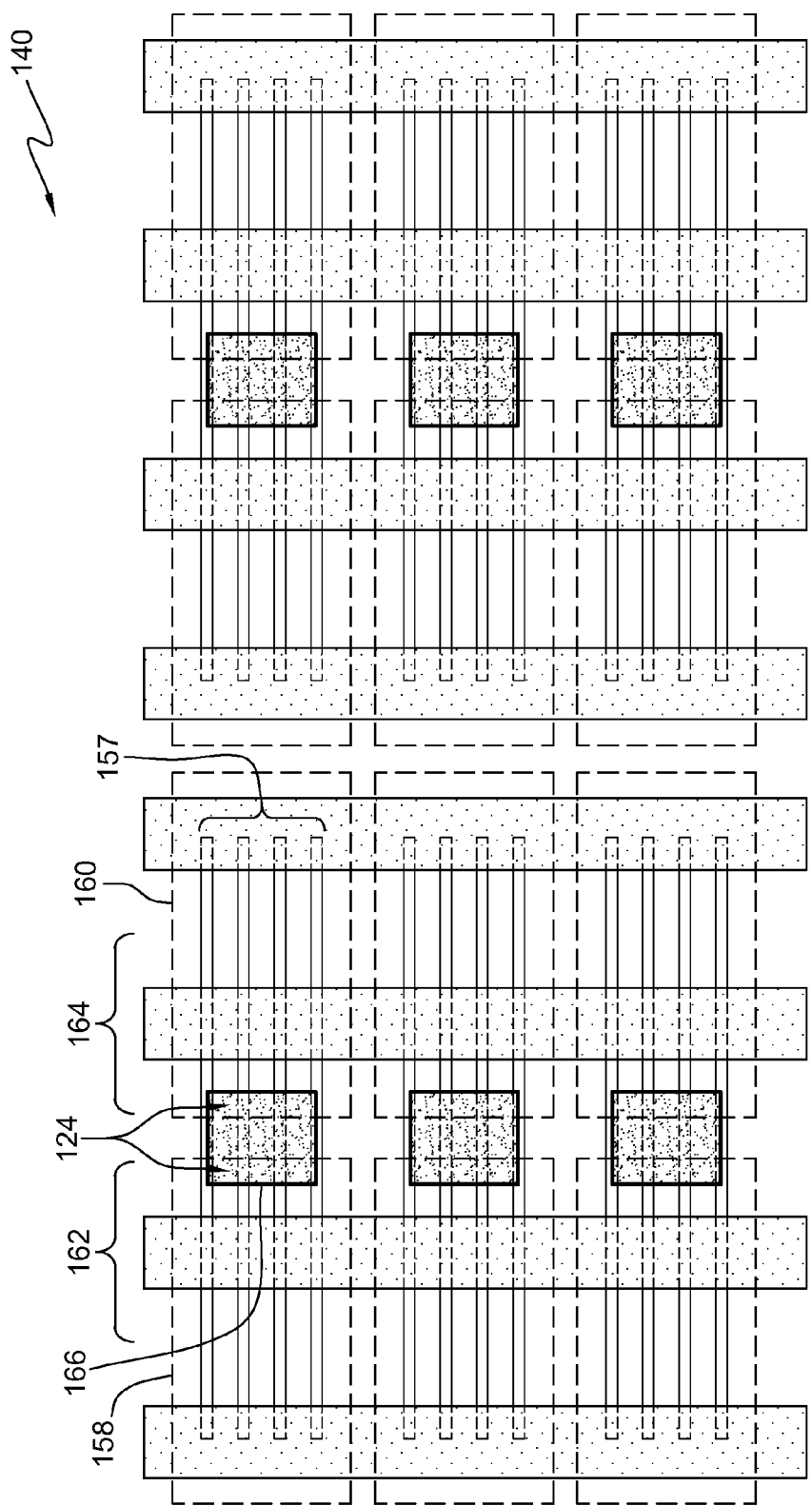
FIG. 7 is a top-down view of the array of FIG. 6, the array including six groups of four fins, creating one memory cell per group, and the six memory cells are organized into two columns and three rows of a DRAM array, the sources of the access transistors being arranged back-to-back, enabling shared contacts, in accordance with one or more aspects of the present invention.

FIG. 7 is a top-down view of the array 140 of FIG. 6, the array including six groups of four fins (e.g., group 156), creating one memory cell per group, and the six memory cells are organized into two columns and three rows or in a DRAM array, the sources 124 of the access transistors (e.g., transistors 162 and 164) being arranged back-to-back, enabling shared contacts (e.g., contact 166), in accordance with one or more aspects of the present invention.

Figure 8:
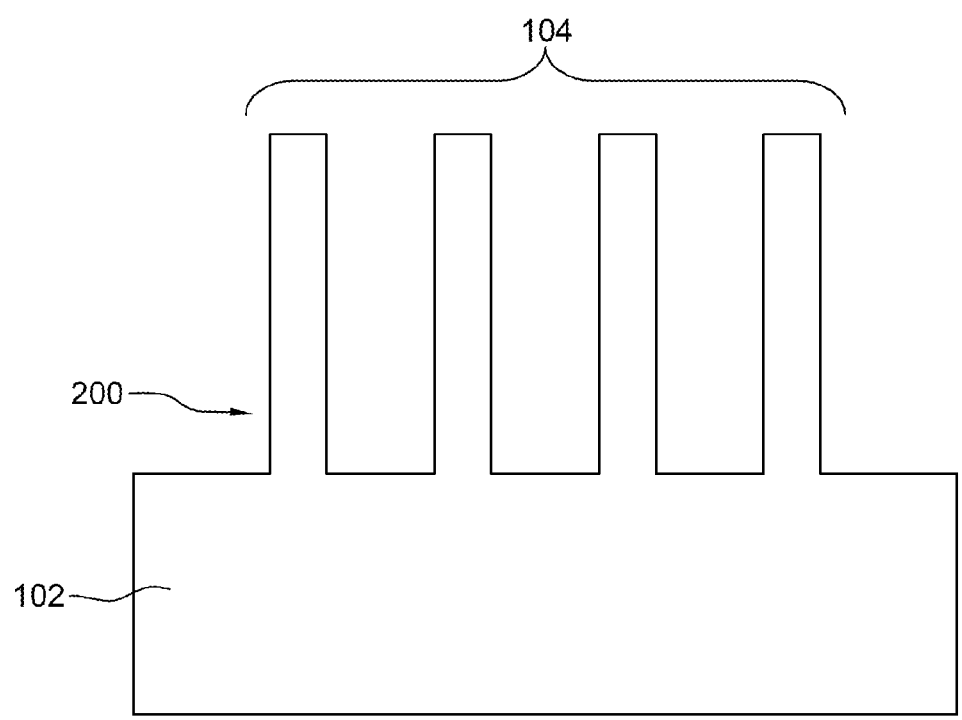
FIG. 8 is a side view of one example of the structure of FIG. 1 at an earlier stage of fabrication with only the bulk substrate and the fins coupled thereto, in order to show a bottom portion of the fins that will, at the stage of FIG. 1, be covered by the isolation material, in accordance with one or more aspects of the present invention.
Figure 9:
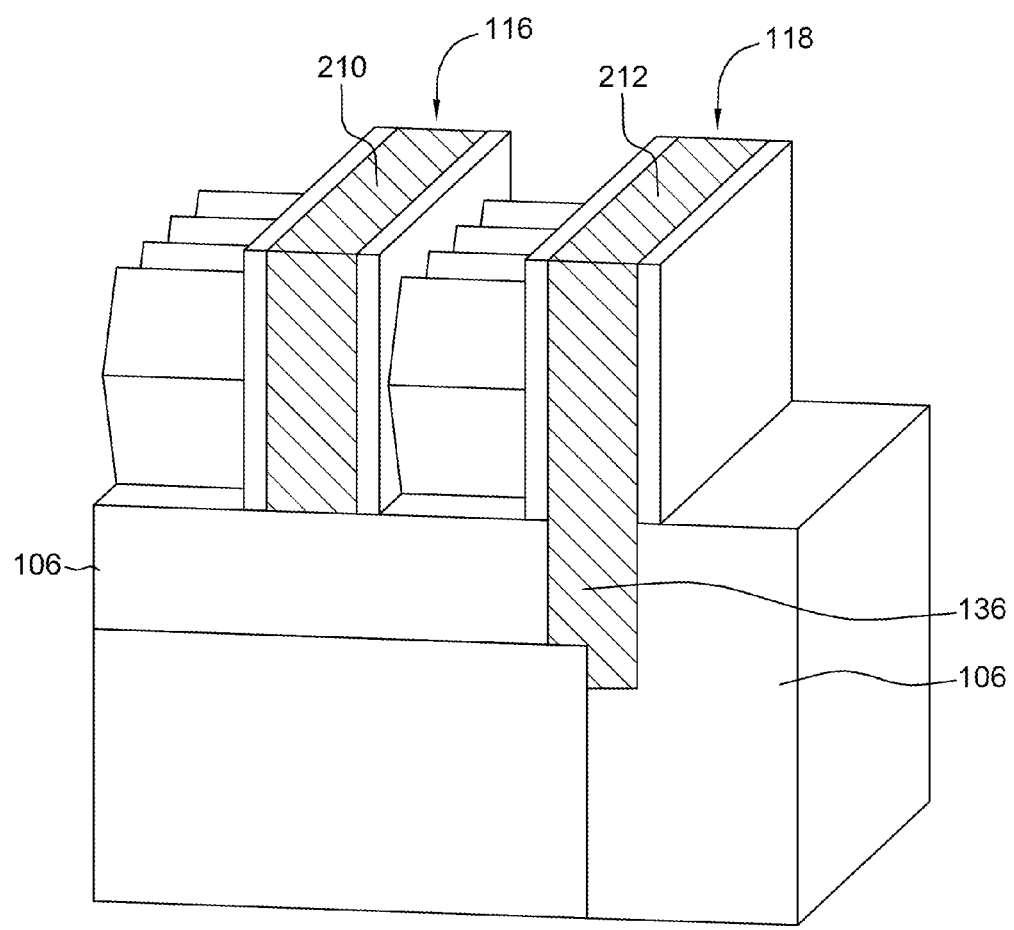
FIG. 9 depicts one example of the structure of FIG. 4 after forming first and second gates in the spacer-defined areas, in accordance with one or more aspects of the present invention.

FIG. 8 is a side view of one example of the structure of FIG. 1 at an earlier stage of fabrication with only bulk substrate 102 and fins 104 coupled thereto, in order to show a bottom portion 200 of the fins that will, at the stage of FIG. 1, be covered by isolation material 106, in accordance with one or more aspects of the present invention FIG. 9 depicts one example of the structure of FIG. 4 after forming first and second gates 210 and 212 in spacer-defined areas 116 and 118, respectively, in accordance with one or more aspects of the present invention.

In a first aspect, disclosed above is a semiconductor device. The semiconductor device includes a semiconductor substrate, at least one fin coupled to the substrate and surrounded at a bottom portion thereof by isolation material, each fin including a source region, a drain region and a channel region therebetween, a first gate and spacers over a center portion of each fin, and a second gate and spacers, the second gate encompassing a common end portion of each fin. The first gate and corresponding source and drain regions act as an access transistor, and the second gate and common end portion(s) of the fin(s) act as a storage capacitor.

In one example, the access transistor and the storage capacitor together make, for example, a first memory cell.

In one example, the semiconductor device may further include, for example, additional memory cell(s) organized into rows and columns of an array of memory cells. In one example, the gate electrodes of the storage capacitors may be, for example, electrically coupled together as a column in the array of memory cells to the plate for proper applying voltage bias. In another example, the sources of the access transistors in the same column may be, for example, electrically coupled together as a bit-line, and each drain of each access transistor is electrically coupled to a corresponding storage capacitor through at least a corresponding fin.

In one example, the additional memory cell(s) may include, for example, a second memory cell, the first and second memory cells being part of a row, the gate of the access transistor of the first memory cell and the gate of the access transistor of the second memory cell being connected together as a word line, and the gates of the storage capacitors being connected to separate bit lines.

In one example, the semiconductor device of the first aspect may include, for example, a trench in the isolation material beneath the storage capacitor and filled with the gate electrode of the storage capacitor.

In one example, the storage capacitor of the semiconductor device of the first aspect may, for example, be coupled to the drain of the access transistor, and the semiconductor device may further include, for example, other storage capacitor(s) (fabricated in BEOL) coupled to the source of the access transistor.

In one example, the gate electrode of the access transistor of the semiconductor device of the first aspect may include, for example, a work-function material of n-type or p-type to match a type of the access transistor, and the gate electrode of the storage capacitor may include, for example, a work-function material of opposite type than that of the work-function material of the access transistor.

In one example, the sources and drains of the fins of the semiconductor device (in one cell) of the first aspect may include, for example, epitaxial semiconductor material, the epitaxial semiconductor material of the adjacent sources is merged, and the epitaxial semiconductor material of adjacent drains is merged.

In one example, a plurality of the semiconductor device of the first aspect may be, for example, placed in an array, and a top surface of each second gate acts as a plate for the corresponding storage capacitor.

In a second aspect, disclosed above is a method of forming a FinFET-based memory cell. The method includes providing a three-dimensional semiconductor structure, the structure including a semiconductor substrate, and fins coupled to the substrate with lower portions thereof being surrounded by isolation material, the isolation material extending beyond a common end of the fins, source, drain and channel regions situated in each fin, and a first dummy gate structure spanning the channel regions of the fins. The method further includes forming a second dummy gate structure encompassing the common end of the fins, and replacing dummy gate material of the first and second dummy gate structures with corresponding first and second metal gates, each metal gate including a dielectric layer on the fin (e.g., high-k dielectric), work-function layer(s), and an electrode. A transistor formed by the source regions, drain regions, channel regions, and the first metal gate acts as an access transistor for a memory cell, and the second metal gate acts as a storage capacitor.

In one example, the replacing may include, for example, removing the dummy gate material and forming the replacement metal gates (RMG) structure, and the method may further include, for example, between removing the dummy gate material and forming the metal gates (e.g., deposition of high-k, work function, and metal electrode layers and followed by CMP), removing a portion of the isolation material surrounding the common end of the fins, exposing more of the common end, increasing a storage capacity of the storage capacitor.

In one example, the drain regions in the method of the second aspect may be, for example, situated adjacent the storage capacitor, and the memory cell may further include, for example, a second storage capacitor electrically coupled to the drain regions.

In one example, the "plate" electrode of the storage capacitor in the method of the second aspect may be biased to Vcc or Vcc/2, e.g., during memory operations of read or program.

In one example, the method of the second aspect may further include, for example, a common contact for the source regions, the common contact acting as a bit line for each column of memory cells. The first metal gate of cells in the same row may be connected together and acts as a word line for the row of memory cells.

In one example, the memory cells may be, for example, co-fabricated to form an array of memory cells situated in rows and columns, and the sources of the access transistors in a column may be, for example, electrically coupled to act as a shared bit line for the column in an array, and the "plate" electrodes of the storage capacitors may be, for example, electrically coupled together and may be biased in use to Vcc or Vcc/2. All conventional array architecture known to those skilled in the art can be applicable to the memory cells of the present invention.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A semiconductor device, comprising:
   a semiconductor substrate;
   at least one fin coupled to the substrate and surrounded at a bottom portion thereof by isolation material, each fin comprising a source region, a drain region and a channel region therebetween;
   a first gate and spacers over a portion of each fin; and
   a second gate and spacers, the second gate encompassing a common end portion of the at least one fin;
   wherein the first gate and corresponding source and drain regions comprise an access transistor, and wherein the second gate and common end portion of the at least one fin act as a storage capacitor.

2. The semiconductor device of claim 1, wherein the access transistor and the storage capacitor together comprise a first memory cell.

3. The semiconductor device of claim 2, further comprising at least one additional memory cell to create a row or a column in an array of memory cells.

4. The semiconductor device of claim 3, wherein the gate electrodes of the storage capacitors are electrically coupled together as a column in the array of memory cells.

5. The semiconductor device of claim 4, wherein the sources of the access transistors in a same column are electrically coupled together as a bit line, and wherein each drain of each access transistor is electrically coupled to a corresponding storage capacitor through at least a corresponding fin.

6. The semiconductor device of claim 3, wherein the at least one additional memory cell comprises a second memory cell, wherein the first and second memory cells are part of a row, wherein the gate of the access transistor of the first memory cell and the gate of the access transistor of the second memory cell are connected together as a word line, and wherein the gates of the storage capacitors are connected to separate bit lines.

7. The semiconductor device of claim 1, further comprising a trench in the isolation material beneath the storage capacitor and filled with the gate electrode of the storage capacitor.

8. The semiconductor device of claim 1, wherein the storage capacitor is coupled to the drain of the access transistor, the semiconductor device further comprising at least one other storage capacitor coupled to the source of the access transistor.

9. The semiconductor device of claim 1, wherein the gate electrode of the access transistor comprises a work-function material of n-type or p-type to match a type of the access transistor, and wherein the gate electrode of the storage capacitor comprises a work-function material of opposite type than that of the work-function material of the access transistor.

10. The semiconductor device of claim 1, wherein the sources and drains of the plurality of fins comprise epitaxial semiconductor material, wherein the epitaxial semiconductor material of the adjacent sources is merged, and wherein the epitaxial semiconductor material of adjacent drains is merged.

11. The semiconductor device of claim 1, wherein a plurality thereof are placed in an array, and wherein a top surface of each second gate acts as a plate for the corresponding storage capacitor.

* * * * *